United States Patent
Shintani et al.

(10) Patent No.: US 7,517,223 B1
(45) Date of Patent: Apr. 14, 2009

(54) CONTROLLED IMPEDANCE BUS WITH A BUFFER DEVICE

(75) Inventors: Peter Shintani, San Diego, CA (US); Kenichiro Toyoshima, San Diego, CA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 0 days.

(21) Appl. No.: 12/053,474

(22) Filed: Mar. 21, 2008

(51) Int. Cl.
*H01R 12/00* (2006.01)
(52) U.S. Cl. .................................................. 439/60
(58) Field of Classification Search .................. 436/60, 436/59, 61, 62, 63, 34, 65, 951; 174/262; 361/803; 439/101, 579
See application file for complete search history.

(56) References Cited

U.S. PATENT DOCUMENTS

| | | | | |
|---|---|---|---|---|
| 4,552,420 A | * | 11/1985 | Eigenbrode | 439/67 |
| 4,889,500 A | * | 12/1989 | Lazar et al. | 439/579 |
| 5,094,623 A | * | 3/1992 | Scharf et al. | 439/101 |
| 5,341,040 A | * | 8/1994 | Garverick et al. | 326/27 |
| 5,629,839 A | * | 5/1997 | Woychik | 361/803 |
| 6,234,807 B1 | * | 5/2001 | Amini et al. | 439/60 |
| 7,190,412 B2 | | 3/2007 | Ellett | |
| 7,224,595 B2 | * | 5/2007 | Dreps et al. | 365/63 |
| 7,338,290 B2 | * | 3/2008 | Motohashi et al. | 439/60 |
| 2005/0169033 A1 | * | 8/2005 | Sugita et al. | 365/63 |
| 2006/0143679 A1 | | 6/2006 | Yamada et al. | |
| 2007/0206122 A1 | | 9/2007 | Dickens et al. | |

OTHER PUBLICATIONS

Analog Devices; Buffered 2:1 TMDS Switch, AD8193; 2007; pp. 1-16; Norwood, MA.
Jeff Dunnihoo, California Micro Devices Corp; Sample HDMI PCB Layouts with MediaGuard; CM2020/CM2021; May 17, 2005; pp. 1-6; Milpitas, CA.
Analog Devices; 4:1 HDMI/DVI Switch with Equalization, AD8191; 2006; pp. 1-32; Norwood, MA.
Analog Devices; 2:1 HDMI/DVI Switch with Equalization, AD8196; 2007; Norwood, MA.
Maxim Integrated Products; Interfacing to the MAX3815 DVI/HDMI Cable Equalizer, HFDN-41.0; Jun. 2006; pp. 1-4.
California Micro Devices; HDMI Receiver Port Protection and Interface Device, CM2031; Nov. 16, 2007; pp. 1-14; Milpitas, CA.

(Continued)

*Primary Examiner*—Chandrika Prasad
(74) *Attorney, Agent, or Firm*—Blakely, Sokoloff, Taylor & Zafman LLP

(57) ABSTRACT

A controlled impedance bus includes a pair of bus traces that carry a transmission minimized differential signal (TMDS). Two or more buffer output terminals. Each output terminal includes a pair of pads connected to the pair of bus traces such that unused pads create minimal stubs on the pair of bus traces. Two or more buffer input terminals are provided. Each of the buffer input terminals includes a pair of connector traces that extend substantially perpendicular to the bus traces. At least one connector is connected to a first end of the pair of connector traces of one of the buffer input terminals. At least one buffer device is connected to a second end of the pair of connector traces and to the pair of pads of one of the buffer output terminals. The buffer device provides signals on the pair of bus traces when enabled by an enable input.

20 Claims, 5 Drawing Sheets

OTHER PUBLICATIONS

HDMI Licensing, LLC; High-Definition Multimedia Interface, Specification Version 1.3a; Nov. 10, 2006; pp. 1-97.
Texas Instruments; 3-to-1 DVI/HDMI Switch, TMDS341A; May 2006, revised Nov. 2006; pp. 1-25.
Texas Instruments; Single-Chip HDMI Transmitter Port Protection and Interface Device, TPD12S521; pp. 1-8; Oct. 2007.
Texas Instruments; HDMI Hider; Jun. 2006, revised Jun. 2007; pp. 1-27.

* cited by examiner

CONTROLLED IMPEDANCE BUS WITH A BUFFER DEVICE

BACKGROUND

1. Field

Embodiments of the invention relate to the field of busses for very high speed digital signals; and more specifically, to providing a flexible arrangement of multiple high speed connectors.

2. Background

Modern digital systems are using interconnections to carry signals at increasingly high frequencies. For example, the High-Definition Multimedia Interface (HDMI) and the Digital Video Interface (DVI) use cables that carry signals at data rates of up to 3.4 Gbps.

The audiovisual (AV) data carried on these high speed channels is encoded by a technique called Transition Minimized Differential Signaling (TMDS). TMDS uses paired signal wires with a controlled differential impedance of $100\Omega$ to maintain signal integrity. Because of the very high data rates, every aspect of the signal path must be carefully designed and built to exacting tolerances to maintain the differential impedance of the data paths.

In the HDMI/DVI standard, four differential pairs carry the TMDS signals. For DVI, three of these pairs are dedicated to carrying RGB video and sync data. For HDMI, audio data is also interleaved with the video data; the DVI standard does not incorporate audio information. The fourth high speed differential pair is used for the AV clock and runs at one-tenth the speed of the TMDS data channels.

To ensure interoperability of components using HDMI signaling, components are required to successfully pass compliance testing at an Authorized Testing Center ("ATC") authorized by the HDMI Founders for testing products in accordance with the HDMI Compliance Test Specification prior to mass production or distribution if such product claims conformance to the High-Definition Multimedia Interfaces or bears any Adopted Trademark. Such compliance testing typically includes Display Data Channel (DDC) bus capacitance, TMDS line characteristic impedance, and consumer electronics control (CEC) bus capacitance.

HDMI components, such as video display devices, typically provide more than one HDMI connector to accommodate several sources of audiovisual content that may be selected for display. Components may be members of a family of devices that provide varying levels of capabilities while sharing a common core of basic functionality. The number of HDMI connectors provided may be such a variable capability.

It would be desirable to provide a system that allows a variable number of high speed connectors to be provided on a device without requiring that every configuration undergo time-consuming compliance testing. It would be desirable for such system to be inexpensive to manufacture.

SUMMARY

A controlled impedance bus includes a pair of bus traces that carry a signal using transmission minimized differential signaling (TMDS). Two or more buffer output terminals. Each output terminal includes a pair of pads connected to the pair of bus traces such that unused pads create minimal stubs on the pair of bus traces. Two or more buffer input terminals are provided. Each of the buffer input terminals includes a pair of connector traces that extend substantially perpendicular to the bus traces. At least one connector is connected to a first end of the pair of connector traces of one of the buffer input terminals. At least one buffer device is connected to a second end of the pair of connector traces and to the pair of pads of one of the buffer output terminals. The buffer device provides signals on the pair of bus traces when enabled by an enable input.

Other features and advantages of the present invention will be apparent from the accompanying drawings and from the detailed description that follows below.

BRIEF DESCRIPTION OF THE DRAWINGS

The invention may best be understood by referring to the following description and accompanying drawings that are used to illustrate embodiments of the invention by way of example and not limitation. In the drawings, in which like reference numerals indicate similar elements.

DETAILED DESCRIPTION

Figure 1:
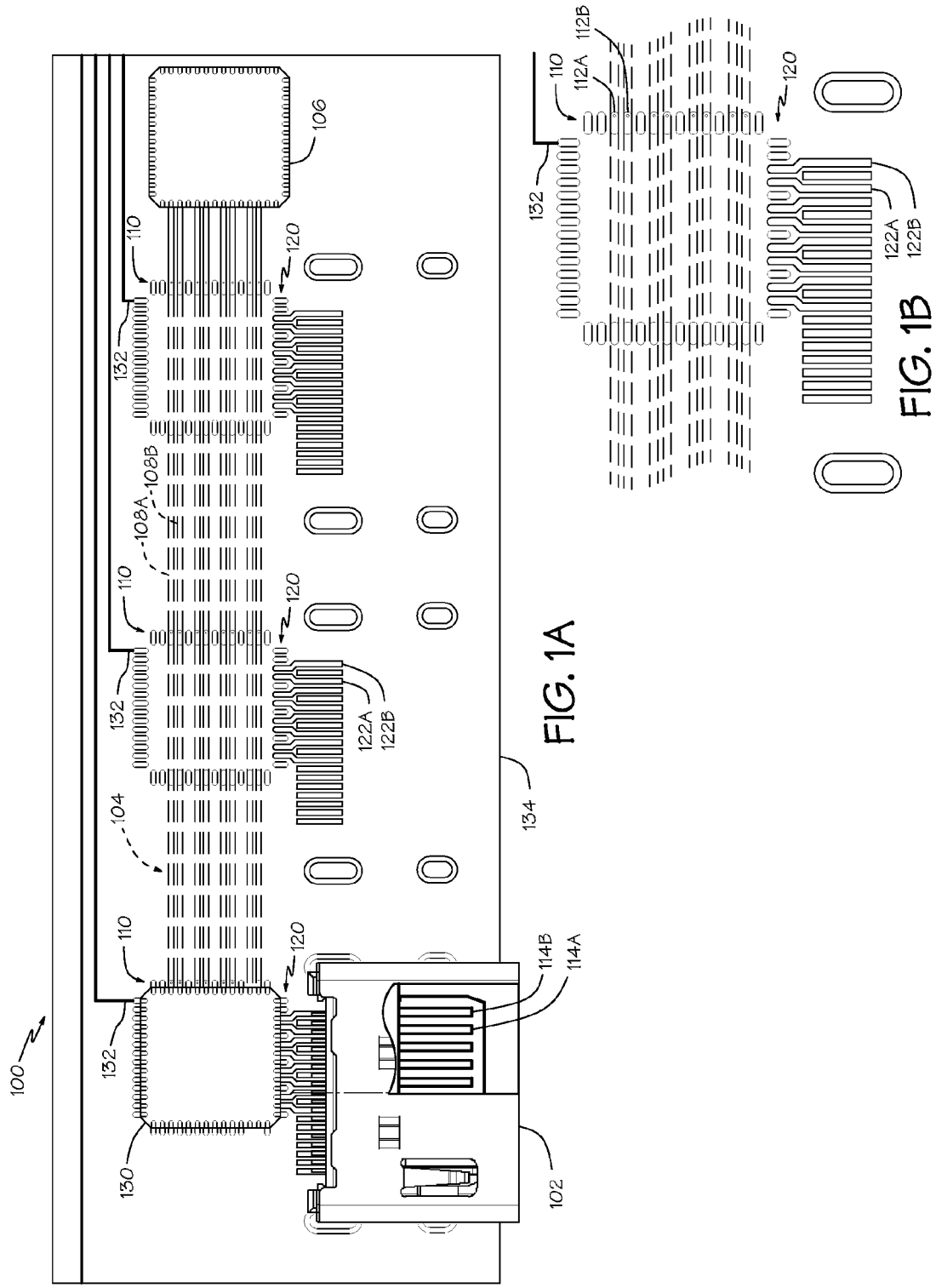
FIG. 1A is a plan view of a bus subsystem that embodies the invention.
FIG. 1B is an enlarged portion of the bus subsystem of FIG. 1A.

One aspect of the present disclosure relates to a system architecture in which a connector subassembly including a buffer chip is used to isolate the external connection from the remainder of the system. In one embodiment, a High-Definition Multimedia Interface (HDMI) connector subassembly includes much or all of the system that requires compliance testing. In certain embodiments, the incorporation of an HDMI buffer chip may alleviate signal attenuation and be helpful in meeting HDMI-related compliance testing requirements.

Another aspect of the invention is to provide a bus structure that allows a variable number of connector subassemblies to be connected to the same main assembly to allow a family of devices to be built from common components.

In the following description, numerous specific details are set forth. However, it is understood that embodiments of the invention may be practiced without these specific details. In other instances, well-known circuits, structures and techniques have not been shown in detail in order not to obscure the understanding of this description.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment", "certain embodiments", "an embodiment" or similar term means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner on one or more embodiments without limitation.
Exemplary Embodiments FIG. 1A shows a bus subsystem 100 configured in accordance with the principles of the invention. The exemplary bus subsystem shown is a portion of an audio-visual system that provides one or more HDMI connectors 102 to receive audio-visual programming in a digital format.

The bus subsystem 100 provides a controlled impedance bus 104 to couple the one or more connectors 102 to a receiving device 106, such as an HDMI receiver. The controlled impedance bus 104 includes a pair of bus traces 108a, 108b that carry a high speed digital signal using Transmission Minimized Differential Signaling (TMDS). An exemplary high speed digital signal would be an HDMI data signal with a data rate of gigabits per second (Gbps). The controlled impedance bus 104 may include several pairs of bus traces, each pair carrying a high speed digital TMDS signal. For example, in the exemplary bus subsystem 100 shown, the controlled impedance bus 104 includes four pairs of bus traces to transmit the high speed signaling for an HDMI link.

The controlled impedance bus 104 includes two or more buffer output terminals 110, each of the buffer output terminals including a pair of pads 112a, 112b connected to the pair of bus traces 108a, 108b. Each pad may be constructed such that unused pads create minimal stubs on the pair of bus traces, which is an important consideration because of the high speed signals carried on the controlled impedance bus 104.

The controlled impedance bus 104 includes two or more buffer input terminals 120. Each of the buffer input terminals includes a pair of connector traces 122a, 122b that extend substantially perpendicular to the bus traces 108a, 108b.

The bus subsystem 100 provides at least one connector 102 to receive high speed digital signaling. The connector includes a pair of contacts 114a, 114b to receive a high speed digital TMDS signal. The contacts 114a, 114b are connected to a first end of the pair of connector traces 122a, 122b of one of the buffer input terminals 120. It will be appreciated that the connector may include ground contacts to form a controlled impedance link with a connected cable. The exemplary connector 102 shown is an HDMI connector with a portion of an external shell cut away to show the contacts within the outer shell.

A buffer device 130 is connected to a second end of the pair of connector traces 122a, 122b opposite the connector 102. The buffer device 130 is further connected to the pair of pads 112a, 112b of the associated buffer output terminal 110. The buffer device provides a high speed digital TMDS signal on the pair of bus traces 108a, 108b. The signal may be the signal on the pair of connector traces or it may be a buffered replica of the signal on the pair of connector traces.

It is significant that the input terminal 120 is not connected to the bus traces when the input terminal is not populated with a buffer device 130. This structure allows a variable number of connectors 102 to be provided by the bus subsystem 100. When a connector is not provided, the associated input terminal 120 and output terminal 110 are not populated with a buffer device 130. Only the unpopulated pads 112a, 112b of the output terminal 110 are left on the pair of bus traces 108a, 108b of the controlled impedance bus 104. The unpopulated pads 112a, 112b are constructed to provide minimal stubs on the pair of bus traces, thus minimizing signal degradation on the controlled impedance bus 104 due to a reduced complement of connectors. Further, the buffer device 130 isolates components that require certification, such as testing for compliance with the HDMI Compliance Test Specification, from the controlled impedance bus 104 and the balance of the system. This may permit a system to be designed so that it can be configured with a variable number of connectors without requiring a full certification of each configuration.

An enable input 132 is associated with each of the buffer output terminals 110. The buffer device 130 is connected to the enable input to provide the signal on the pair of bus traces when enabled by the enable input. The enable input 132 may be a discrete signal associated with each buffer output terminal 110 as shown in FIG. 1. In other embodiments, the enable input 132 may be a coded signal provided on one or signal lines connected to all the provided buffer output terminals 110. For example, the enable input may be provided on an Inter Integrated Circuit (I²C) serial bus.

Successful high speed TMDS differential signal routing is a complex system design challenge. Adding even the most minute parasitic loading for ESD protection to these finely tuned transmission lines can often be the difference between passing or failing compliance testing. The resulting transmission line characteristics and impedance matching cannot be easily predicted from mere component level specifications, and indeed, some counter-intuitive results may be observed. For example, adding trace inductance or stubs can, in certain cases, actually improve the characteristic impedance of the line.

The present invention separates the portion of the system subject to stringent compliance testing, the connector, from the remainder of the system. Designing a compliant connector is complicated by the need to accommodate a wide variety of connected devices and connecting cables. This requires the connector and associated connections to meet tight tolerances for the electrical characteristics presented to connecting devices. The present invention confines the compliance requirements to the connector 102, the buffer device 130, and the interconnecting connector traces 122a, 122b. This may allow each connector subsystem to be designed and fabricated to exacting tolerances without imposing the complexity and expense on the remainder of the system.

The controlled impedance bus 104 also represents a complex system design challenge. The present invention further separates the controlled impedance bus from the connectors so that the bus is not subject to the stringent compliance testing required for the connectors. This separation also makes the design of the controlled impedance bus subject to known and controlled requirements. While it would be difficult to design a controlled impedance bus 104 that allowed a variable number of connectors to be present on the bus that could pass the stringent compliance testing required for the connectors, it is more practical to design the bus to connect a known number of buffer output terminals 110 to a receiving device 106 with a finite number of configurations for connecting buffer devices 130 to the buffer output terminals.

As shown in FIG. 1A, the pair of bus traces 108a, 108b may be microstrip traces routed on a first side of a printed wiring board 134. In FIG. 1A the first side of the printed wiring board is the bottom side as suggested by drawing the pair of bus traces with dashed lines. Each of the pads 112a, 112b of the two or more buffer output terminals 110 is on a second side of the printed wiring board 134 and is connected to one of the pair of bus traces 108a, 108b by a via. This configuration allows the pads 112a, 112b connected to the pair of bus traces to be constructed such that unused pads create minimal stubs on the pair of bus traces.

Figure 2:
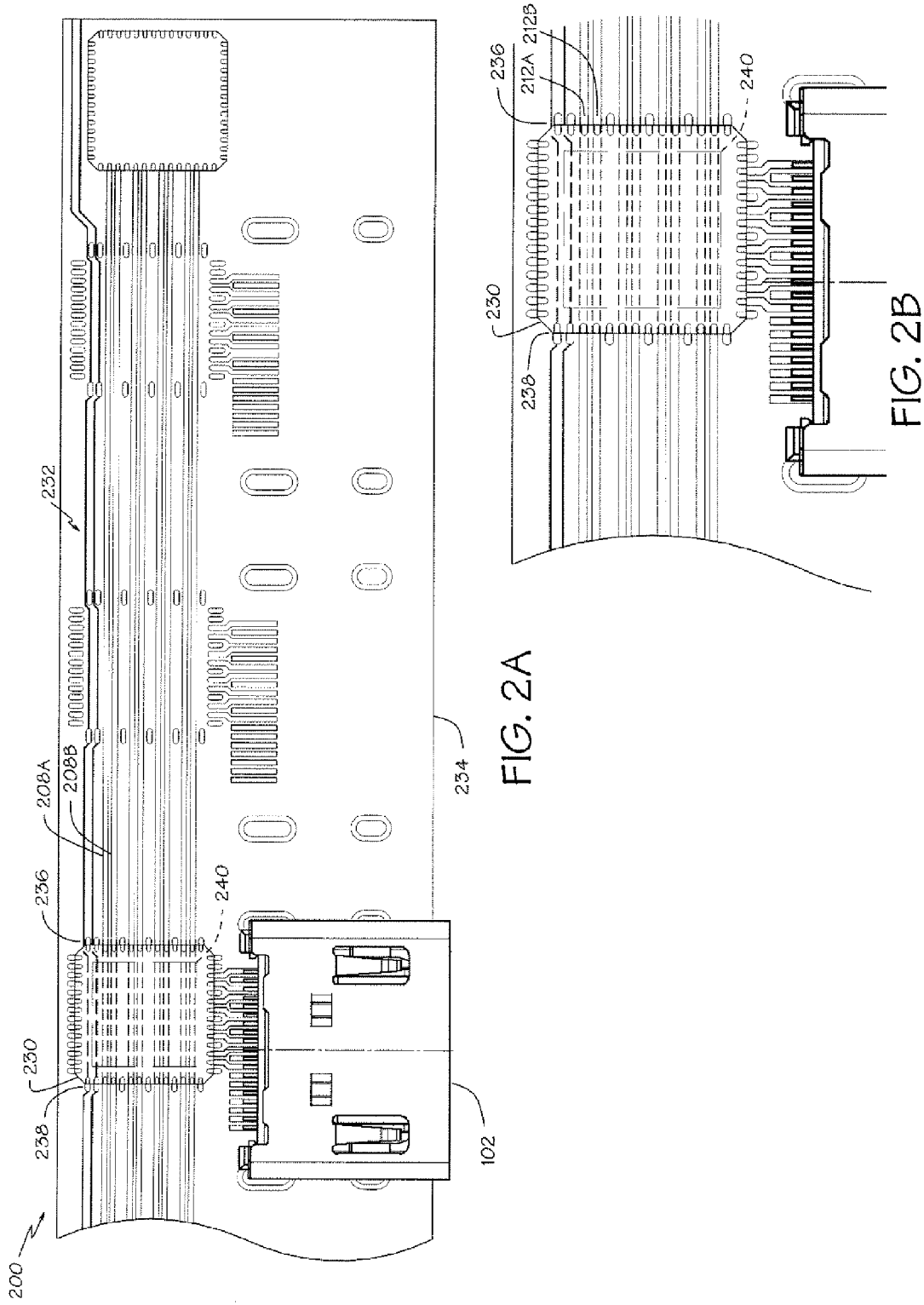
FIG. 2A is a plan view of another bus subsystem that embodies the invention.
FIG. 2B is an enlarged portion of the bus subsystem of FIG. 2A.

FIG. 2 shows another bus subsystem 200 configured in accordance with the principles of the invention. In this embodiment the pair of bus traces 208a, 208b are microstrip traces routed on a first side of a printed wiring board 234 and each of the pads 212a, 212b of the two or more buffer output terminals is a portion of one of the pair of bus traces. In FIG. 2 the first side of the printed wiring board is the top side as suggested by drawing the pair of bus traces with solid lines.

The buffer device 130 may be a rectangular surface mount device that provides connections along each of four sides as shown. The connections to the pair of pads 212a, 212b of the buffer output terminals may be along a first side 236. The connections on the opposing side 238 may be unused allowing them to be connected to the bus traces 208a, 208b.

The buffer device 130 may include a thermal slug to optimize heat transfer from the buffer device. A thermally conductive electrical insulator 240 may thermally couple the thermal slug of the buffer device to the first side of the printed wiring board 234. This may allow improved heat dissipation without creating an electrical short between the bus traces 208a, 208b. An exemplary thermally conductive electrical insulator may be a thermally conductive epoxy paste.

The buffer device 130 and thermally conductive electrical insulator 240 may have a higher permittivity than air. This will lower the impedance of the bus traces 208a, 208b as they pass under the buffer device 130. The bus trace construction may be adjusted to provide a higher impedance in the portions where a buffer device may be placed to reduce the effect of installing a buffer device.

Figure 3:
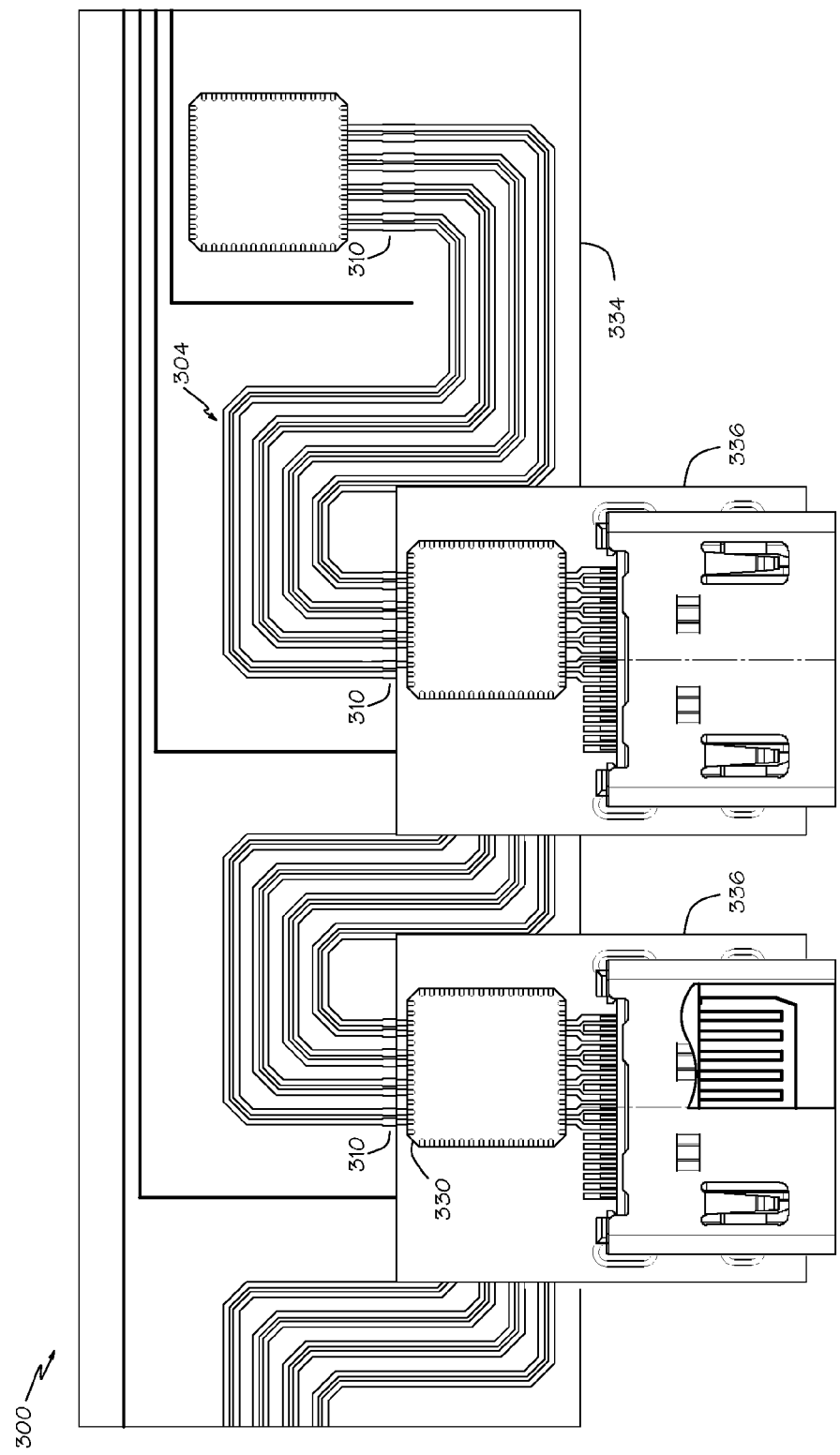
FIG. 3 is a plan view of another bus subsystem that embodies the invention.

FIG. 3 shows another bus subsystem 300 configured in accordance with the principles of the invention. In this embodiment a first printed wiring board 334 includes the controlled impedance bus 304 and the buffer output terminals 310. A second printed wiring board 336 includes one connector 102 and one buffer device 330 assembled to the second printed wiring board. The second printed wiring board 336 is connected to the buffer output terminals 310. The controlled impedance bus 304 may be constructed in a serpentine configuration as shown to facilitate the connection of the second printed wiring board 336 to the buffer output terminals 310. The use of the second printed wiring board to support the connector 102 and the buffer device 330 may allow a rectangular surface mount buffer device to be more easily connected to the controlled impedance bus 304. The use of the second printed wiring board may also allow the use of a more expensive close tolerance printed wiring board for the portion of the device subject to stringent compliance testing while allowing the use of less expensive printed wiring boards in the remainder of the device. Various numbers of second printed wiring boards 336 may be assembled to the one first printed wiring board 334 to provide configurations of the bus subsystem 300 with various numbers of connectors.

Figure 4:
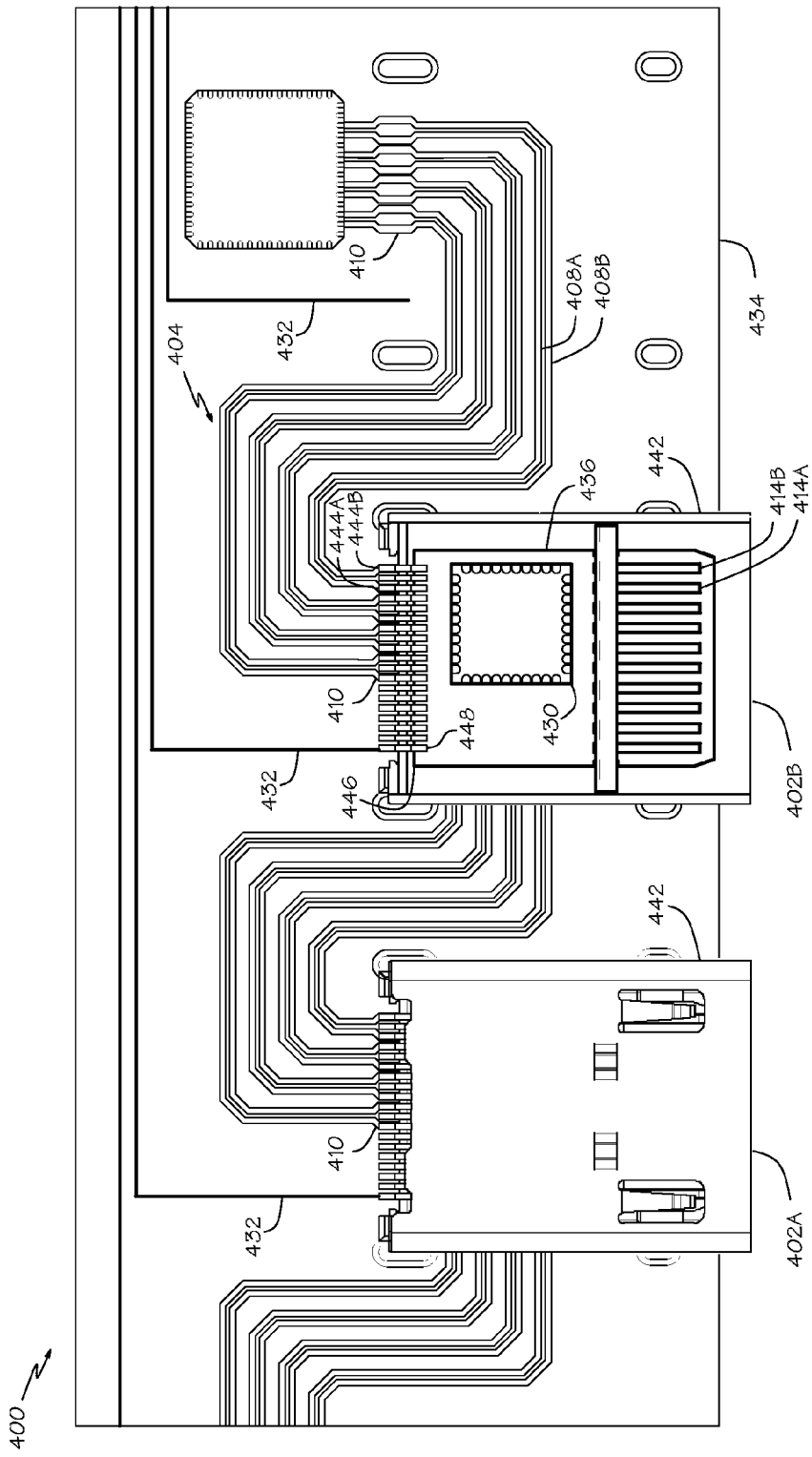
FIG. 4 is a plan view of another bus subsystem that embodies the invention.

FIG. 4 shows another bus subsystem 400 configured in accordance with the principles of the invention. In this embodiment a controlled impedance bus 404 is provided on a first printed wiring board 434 similar that of the previous embodiment. A connector assembly 402A, 402B receives a TMDS from a cable connector and is connected to a pair of bus traces 408A, 408B in the controlled impedance bus 404 on the first printed wiring board 434 to provide the TMDS to the controlled impedance bus. The connector assembly 402A, 402B may be enclosed by a shell 442 that receives the cable connector and provides mechanical support. As may be seen in the figure for the right hand connector assembly 402B in which the shell 442 of the connector assembly is cut away to show the interior components, the connector assembly provides a second printed wiring board 436 that includes a pair of contacts 414A, 414B to receive the TMDS from the cable connector. The shell 442 may enclose the pair of contacts 414A, 414B and at least a portion of the buffer device 430. The shell 442 and the pair of contacts 414A, 414B may be part of a High Definition Multimedia Interface (HDMI) connector.

A buffer device 430 assembled to the second printed wiring board 436 is connected to the pair of contacts 414A, 414B by a second controlled impedance bus to receive a TMDS from the pair of contacts. The buffer device 430 is further connected to a pair of terminals 444A, 444B located at a first edge 446 of the second printed wiring board. The pair of terminals 444A, 444B of the second printed wiring board 436 are connected to the pair of bus traces 408A, 408B of the first printed wiring board 434 to provide the TMDS or a buffered replica of the TMDS. The second printed wiring board further includes an enable input 448 to receive a signal that enables the TMDS provided by the buffer device 430.

Integrating the buffer device 430 with the connector contacts 414A, 414B may allow design of a cost effective HDMI connector 402A, 402B that is compliant with the HDMI Compliance Test Specification. This may allow a variety of HDMI receiver devices to be designed using the compliant HDMI connector so that the overall device does not require HDMI compliance testing. The compliant HDMI connector 402A, 402B in combination with the controlled impedance bus 404 may further permit design of an HDMI receiver device that can be easily configured to include various numbers of HDMI connectors. The integration of the buffer device 430 with the connector contacts 414A, 414B may allow cost effective use of a high grade printed wiring board constructed to exacting tolerances because the area of printed wiring board is minimized and the number of identical assemblies required is maximized. The connector assembly may be configured so that the second printed wiring board is connected to the first printed wiring board at right angles rather than being parallel as shown in FIG. 4. This may allow the controlled impedance bus to be straight rather than serpentine.

Figure 5:
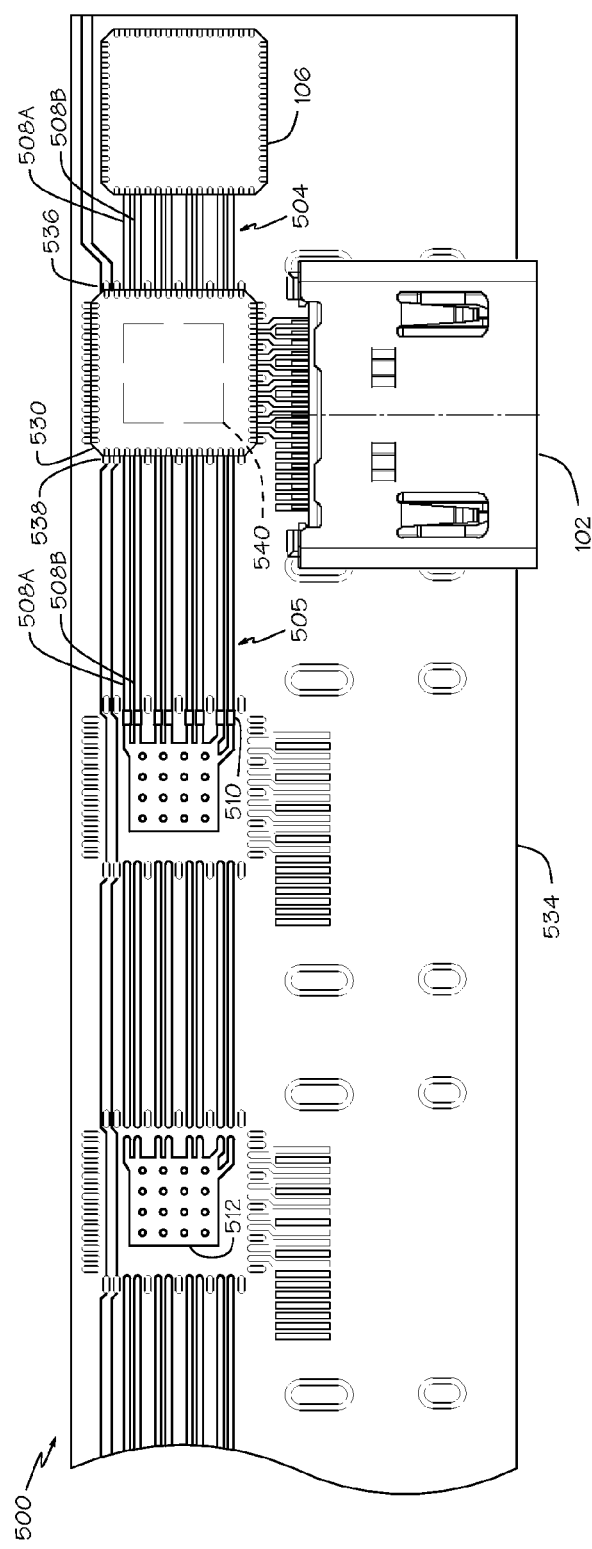
FIG. 5 is a plan view of another bus subsystem that embodies the invention.

FIG. 5 shows another bus subsystem 500 configured in accordance with the principles of the invention. In this embodiment the controlled impedance bus 504 is made up of several segments with discontinuities in the pairs of bus traces 508a, 508b in the areas where buffer devices 530 may be connected to the bus. The buffer device 530 has buffer output terminals on a first side 536 of the device. The buffer device 530 selectively couples the connector 102 to the bus 504. The buffer device 530 further provides a controlled impedance continuation of the bus traces 508a, 508b from the buffer output terminals on the first side 536 of the device to corresponding bus terminals on a second side 538 of the device that is opposite the first side.

Buffer devices 530 are populated onto the controlled impedance bus 504 starting with the position closest to a receiving device 106 that receives signals from the bus. Additional buffer devices may be added to the bus 504 to extend the length of the bus as required for the number of connectors 102 provided. It will be appreciated that there may be a segment of the bus 505 that extends from the buffer device 530 furthest from the receiving device 106 to a position not populated with another buffer device. A resistive termination 510 may be provided at the unpopulated position to reduce reflections of the high speed signals on the bus traces 508a, 508b.

The printed wiring board 534 may provide a thermal pad 512 in the discontinuities of the bus 504. The thermal pad 512 may be soldered to a thermal slug 540 on the buffer device 530 to facilitate the transfer of heat from the buffer device to the printed wiring board 534. The thermal pad 512 may be connected by vias to a ground plane of the printed wiring board 534 to further improve the heat transfer.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those of ordinary skill in the art. The description is thus to be regarded as illustrative instead of limiting.

What is claimed is:

1. A bus subsystem comprising:
a controlled impedance bus including a pair of bus traces that carry a transmission minimized differential signal (TMDS);
two or more buffer output terminals, each of the buffer output terminals including a pair of pads connected to the pair of bus traces, each pad constructed such that unused pads create minimal stubs on the pair of bus traces;
two or more buffer input terminals, each of the buffer input terminals including a pair of connector traces that extend substantially perpendicular to the bus traces;
at least one connector including a pair of contacts connected to a first end of the pair of connector traces of one of the buffer input terminals;
at least one buffer device connected to a second end of the pair of connector traces of the one of the buffer input terminals and the pair of pads of one of the buffer output terminals, the buffer device providing the TMDS on the pair of bus traces.

2. The bus subsystem of claim 1, further comprising an enable input associated with each of the buffer output terminals, the buffer device being further connected to the enable input, the buffer device providing the TMDS on the pair of bus traces when enabled by the enable input.

3. The bus subsystem of claim 1, wherein the pair of bus traces are microstrip traces routed on a first side of a printed wiring board and each of the pads of the two or more buffer output terminals is on a second side of the printed wiring board and is connected to one of the pair of bus traces by a via.

4. The bus subsystem of claim 1, wherein the pair of bus traces are microstrip traces routed on a first side of a printed wiring board and each of the pads of the two or more buffer output terminals is a portion of one of the pair of bus traces.

5. The bus subsystem of claim 4, wherein the buffer device is a rectangular surface mount device that provides connections along each of four sides, the connections to the pair of pads of the buffer output terminals being along a first side and the connections on the opposing side being unused.

6. The bus subsystem of claim 4, further comprising a thermally conductive electrical insulator to thermally couple the buffer device to the first side of the printed wiring board.

7. The bus subsystem of claim 4, further comprising a first printed wiring board that includes the controlled impedance bus and the buffer output terminals, and a second printed wiring board connected to the buffer output terminals, wherein exactly one connector and exactly one buffer device is assembled to the second printed wiring board.

8. The bus subsystem of claim 4, wherein the controlled impedance bus is discontinuous and the buffer device is a rectangular surface mount device that provides connections along each of four sides, the connections to the pair of pads of the buffer output terminals being along a first side and the connections on the opposing side providing continuity to the connections on the first side, the buffer device being connected to the controlled impedance bus across a discontinuity.

9. The bus subsystem of claim 1, wherein the signals provided on the pair of bus traces by the buffer device are buffered replicas of signals on the pair of connector traces.

10. The bus subsystem of claim 1, further comprising a High Definition Multimedia Interface (HDMI) receiver connected to the controlled impedance bus, wherein the connector is an HDMI connector.

11. A bus subsystem comprising:
a controlled impedance bus provided on a first printed wiring board, the controlled impedance bus including a pair of bus traces that carry a transmission minimized differential signal (TMDS); and
at least one connector assembly provided on a second printed wiring board that includes
a pair of contacts to receive the TMDS from a cable connector, and
a buffer device connected to the pair of contacts and a pair of terminals located at a first edge of the second printed wiring board, the pair of terminals being connected to the pair of bus traces of the first printed wiring board to provide the TMDS;
two or more buffer output terminals, each of the buffer output terminals including a pair of pads connected to the pair of bus traces, each pad constructed such that unused pads create minimal stubs on the pair of bus traces.

12. The bus subsystem of claim 11, wherein the second printed wiring board further includes an enable input to receive a signal that enables the TMDS provided by the buffer device.

13. The bus subsystem of claim 11, further comprising a shell to receive the cable connector, the shell enclosing the pair of contacts and at least a portion of the buffer device.

14. The bus subsystem of claim 13, wherein the shell and the pair of contacts are part of a High Definition Multimedia Interface (HDMI) connector.

15. The bus subsystem of claim 11, wherein the buffer device is connected to the pair of contacts by a second controlled impedance bus.

16. A connector assembly comprising:
a printed wiring board that includes
a pair of contacts to receive a transmission minimized differential signal (TMDS) from a cable connector,
a buffer device connected to the pair of contacts, and
a pair of terminals located at a first edge of the printed wiring board and connected to the buffer device to provide an output signal that is a buffered replica of the input signal for connection to a controlled impedance bus that is not included on the printed wiring board.

17. The connector assembly of claim 16, wherein the printed wiring board further includes an enable input to receive a signal that enables the TMDS provided by the buffer device.

18. The connector assembly of claim 16, further comprising a shell to receive the cable connector, the shell enclosing the pair of contacts and at least a portion of the buffer device.

19. The connector assembly of claim 18, wherein the shell and the pair of contacts are part of a High Definition Multimedia Interface (HDMI) connector.

20. The connector assembly of claim 16, wherein the buffer device is connected to the pair of contacts by a second controlled impedance bus.

* * * * *